United States Patent
Bae et al.

(10) Patent No.: US 6,275,429 B1
(45) Date of Patent: Aug. 14, 2001

(54) MEMORY DEVICE AND EQUALIZING CIRCUIT FOR MEMORY DEVICE

(75) Inventors: Yong-cheol Bae, Seoul; Jung-hwa Lee, Suwon, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/592,006

(22) Filed: Jun. 12, 2000

(30) Foreign Application Priority Data

Jul. 14, 1999 (KR) .................................................. 99-28400

(51) Int. Cl.[7] ........................................................ G11C 7/00
(52) U.S. Cl. ........................ 365/203; 365/207; 365/222; 365/204
(58) Field of Search .................................. 365/203, 205, 365/207, 208, 230.03, 204, 222

(56) References Cited

U.S. PATENT DOCUMENTS

| 5,623,446 | * | 4/1997  | Hisada et al. ............... 365/189.11 |
| 5,657,282 | * | 8/1997  | Lee ............................... 365/201 |
| 5,734,619 | * | 3/1998  | Numata et al. ............... 365/230.03 |
| 5,970,006 | * | 10/1999 | Numata et al. ............... 365/203 |
| 6,014,662 | * | 8/2000  | Kim et al. ..................... 365/230.03 |
| 6,108,254 | * | 8/2000  | Watanabe et al. ............ 365/202 |
| 6,128,238 | * | 10/2000 | Nagai et al. .................. 365/207 |

* cited by examiner

Primary Examiner—David Nelms
Assistant Examiner—Gene N. Auduong
(74) Attorney, Agent, or Firm—Skjerven Morrill MacPherson LLP; David W. Heid

(57) ABSTRACT

An input and output line equalizing circuit for connection to a pair of input and output lines of a memory device. The equalizing circuit includes an equalization control circuit providing at an output a precharge signal, and an equalizing unit connected to the input and output lines. The equalizing unit responding to receipt of a precharge signal from the equalization control circuit to maintain the pair of input and output lines at the same voltage level. The equalizing control circuit includes a first transmission gate and a second transmission gate.

7 Claims, 4 Drawing Sheets

MEMORY DEVICE AND EQUALIZING CIRCUIT FOR MEMORY DEVICE

BACKGROUND OF THE INVENTION

1. Field of the Invention

The present invention relates to a memory device, and more particularly, to an input and output line equalizing circuit which optimizes the efficiency of a layout and a memory device using the equalizing circuit.

2. Description of the Related Art

In general, semiconductor memory devices include equalizing circuits for maintaining a pair of bit lines, or a pair of input and output lines, at a certain level in order to increase data reading or writing speed. The equalizing circuit provides a certain level of voltage to the pair of bit lines, or the pair of input and output lines, via which data is transmitted and maintains the voltage levels of the pair of bit lines, or the pair of input and output lines, equal. Namely, the equalizing circuit increases the data reading or writing speed by maintaining the pair of bit lines, or the pair of input and output lines, at a certain voltage level before a data reading or writing operation is performed.

The time for precharging the pair of input and output lines using the equalizing circuit has increased due to the increase of loading and resistance of the pair of input and output lines in view of the high level of integration at memory devices.

In order to solve this problem, a method of precharging the pair of input and output lines from both ends has been recently provided. Namely, the pair of input and output lines are precharged from both ends by arranging the equalizing circuit at both ends of the pair of input and output lines. Accordingly, the speed at which the pair of input and output lines are precharged increases.

FIGS. 1 and 2 are circuit diagrams showing generally used conventional equalizing circuits. FIG. 3 is a timing diagram of the main signals used for the equalizing circuits shown in FIGS. 1 and 2.

Referring to FIG. 1, an equalizing circuit 10, which is an example of a conventional technology, is arranged between a pair of input and output lines IO and IOB and operates in response to a precharge signal IOPRGB. The equalizing circuit 10 includes an equalizing transistor 12 and precharge transistors 14 and 16.

Referring to FIG. 2, an equalizing circuit 20, which is another example of a conventional technology, includes an equalizer 22 arranged between the pair of input and output lines IO and IOB and an equalization control circuit 24 for controlling the equalizer 22. The equalization control circuit 24 includes a NAND gate 26 and an inverter 28 and operates in response to a sensing enable signal LANG and a precharge signal IOPRGB.

The conventional equalizing circuits 10 and 20 are enabled in response to the activation of the precharge signal IOPRGB during an interval in which the sensing enable signal LANG is activated, thus precharging the pair of input and output lines IO and IOB to a predetermined voltage level, for example, a Vcc level, as shown in FIG. 3.

When the conventional equalizing circuits 10 and 20 as shown in FIGS. 1 and 2 are arranged at both ends of the pair of input and output lines IO and IOB, it is possible to reduce the time for restoring the voltage level of the pair of input and output lines to the Vcc level by increasing the speed at which the pair of input and output lines are precharged.

However, when the equalizing circuits 10 and 20 are arranged at both ends of the pair of input and output lines IO and IOB in order to increase the precharge speed, the required layout area is larger than when the equalizing circuits 10 and 20 are arranged at only one end of the pair of input and output lines. In particular, since the NAND gate 26 included in the equalizing circuit 20 shown in FIG. 2 is driven by an internal supply voltage Vcc level, an internal supply voltage supply line must be additionally provided in the peripheral circuit where the equalizing circuit 20 is arranged. Since devices used in the peripheral circuits are generally driven by an external supply voltage, the interial supply voltage supply line is only required for driving the NAND gate 26. Therefore, when the conventional equalizing circuits 10 and 20 are arranged at both ends of the pair of input and output lines, it is possible to increase the precharge speed, however, the required layout area increases.

SUMMARY OF THE INVENTION

To solve the above problem, the present invention provides an input and output line equalizing circuit capable of increasing precharge speed without increasing the required layout area.

The present invention also provides a memory device using the above equalizing circuit.

According to one embodiment of the present invention, an equalizing circuit is provided for connection to a pair of input and output lines of a memory device, the equalizing circuit comprising: an equalization control circuit for providing at an output terminal a precharge signal in response to activation of a first or a second equalization signal; and an equalizing unit having a control terminal coupled to the output terminal of the equalization control circuit, the equalizing unit being connected to the pair of input and output lines, for maintaining the pair of input and output lines at the same voltage level.

According to one aspect of the present invention, in an equalizing circuit of the first embodiment, the equalization control circuit, comprises: a first transmission gate having an input terminal for receiving a precharge signal and an output terminal for outputting the precharge signal in response to the activation of the first equalization signal; and a second transmission gate having input and output terminals commonly connected to the input and output terminals of the first transmission gate, the second transmission gate outputting the precharge signal in response to the activation of the second equalization signal.

According to another embodiment, a memory device is provided which includes first and second memory blocks and a pair of input and output lines which are shared by the first and second memory blocks, the memory device comprising: first and second bitline precharge circuits for precharging to a predetermined voltage a first and a second pair of bitlines associated with the first and second memory blocks respectively; first and second bitline sense amplifiers associated respectively with the first and second pair of bitlines for sensing and amplifying data on the pairs of bitlines; a first and a second block selection switch associated respectively with said first and second memory blocks, and a first and a second column selection gate associated respectively with said first and second memory blocks for connecting a selected pair of bitlines of a selected memory block to the pair of input and output lines; a first equalizing circuit coupled to the pair of input and output lines at a first location; and a second equalizing circuit coupled to the pair of input and output lines at a second location spaced apart from said first location.

According to another aspect of the present invention, in the immediately preceding embodiment, the first equalizing circuit comprises: an equalization control circuit for providing at an output terminal a precharge signal in response to activation of a first or a second equalization signal; and an equalizing unit having a control terminal coupled to the output terminal of the equalization control circuit, the equalizing unit being connected to the pair of input and output lines, for maintaining the pair of input and output less at the same voltage level.

According to the present invention, it is possible to improve the layout efficiency of the peripheral circuit since it is not necessary to additionally provide the internal supply voltage supply line.

BRIEF DESCRIPTION OF THE DRAWING(S)

The above objects and advantages of the present invention will become more apparent in light of the description below in connection with the drawings in which.

DESCRIPTION OF THE PREFERRED EMBODIMENT

In order to better understand the present invention and the advantage of the operation of the present invention, reference is made to the drawings illustrating a preferred embodiment of the present invention.

Figure 4:
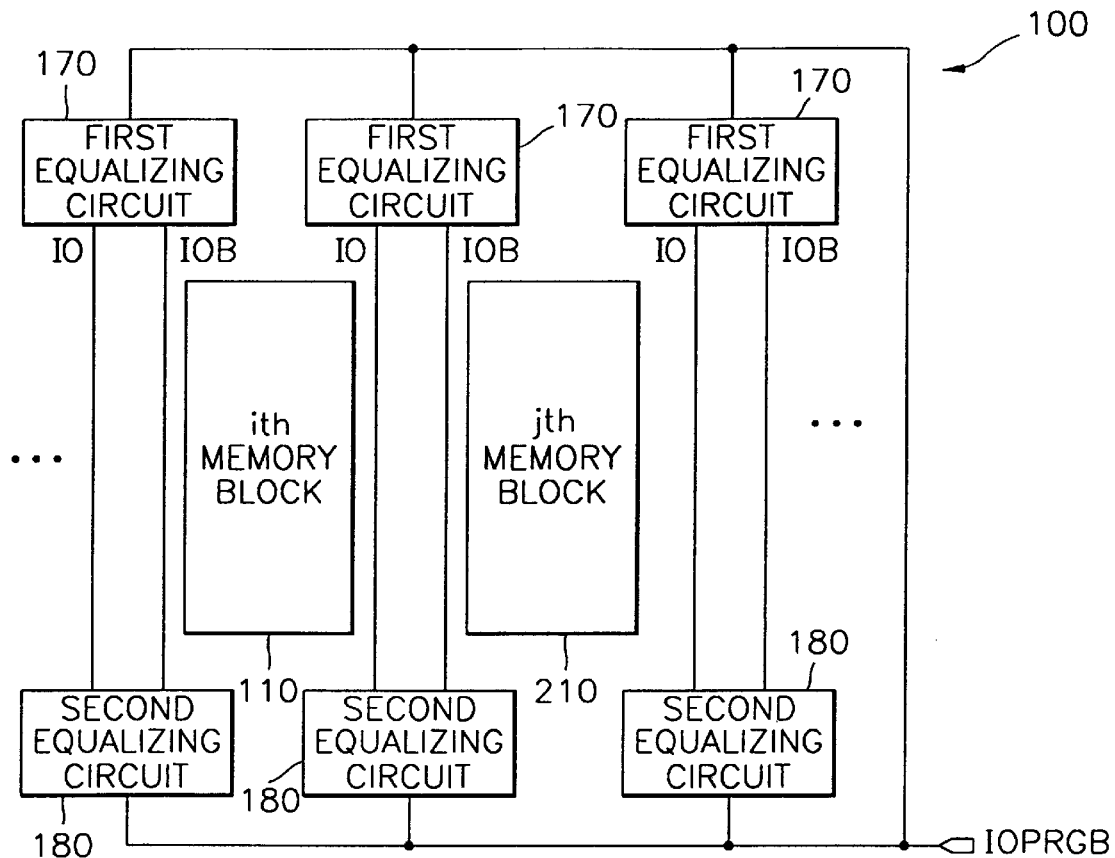
FIG. 4 is a block diagram showing a memory device according to an embodiment of the present invention.

FIG. 4 is a block diagram showing a memory device 100 according to an embodiment of the present invention, wherein ith and jth memory blocks 110 and 210 are shown.

The memory device 100 according to the present invention includes a plurality of memory blocks 110 and 210 and a plurality of first and second equalizing circuits 170 and 180 coupled to associated input and output lines IO and IOB for maintaining the associated pair of input and output lines IO and IOB included in the memory blocks at a predetermined voltage level during a precharge interval.

Data read from a selected memory cell in the memory blocks 110 and 210 are transmitted to an output circuit (not shown) of the memory device through the pair of input and output lines IO and IOB. Data from the outside are written to the selected memory cell in the memory blocks 110 and 210 through the pair of input and output lines IO and IOB.

The first and second equalizing circuits 170 and 180 are controlled by an input and output line precharge signal IOPRGB (shown in FIG. 6), and circuits 170 and 180 are provided at both ends of the pair of input and output lines IO and IOB as shown in FIG. 4. Therefore, the first and second equalizing circuits 170 and 180 precharge the pair of input and output lines at both ends.

Figure 1:
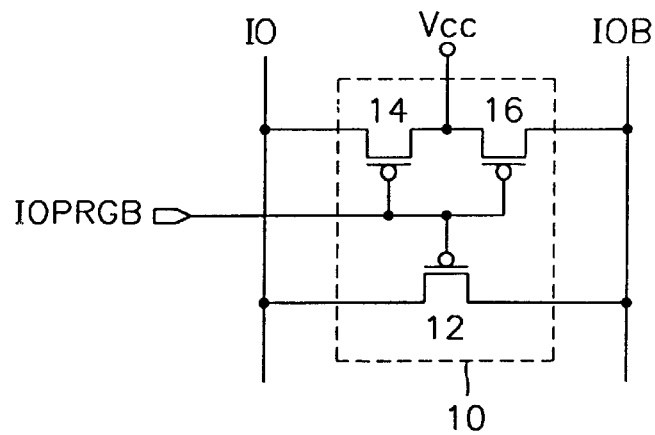
FIGS. 1 and 2 are circuit diagrams showing commonly used conventional equalizing circuits.
Figure 2:
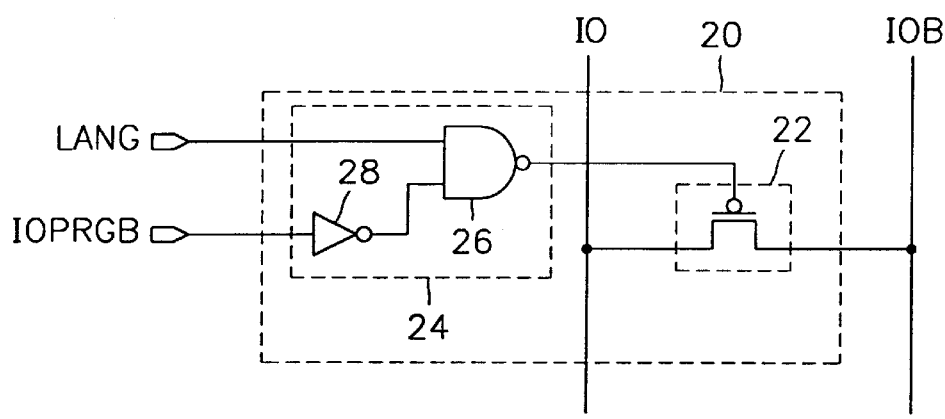
Figure 3:
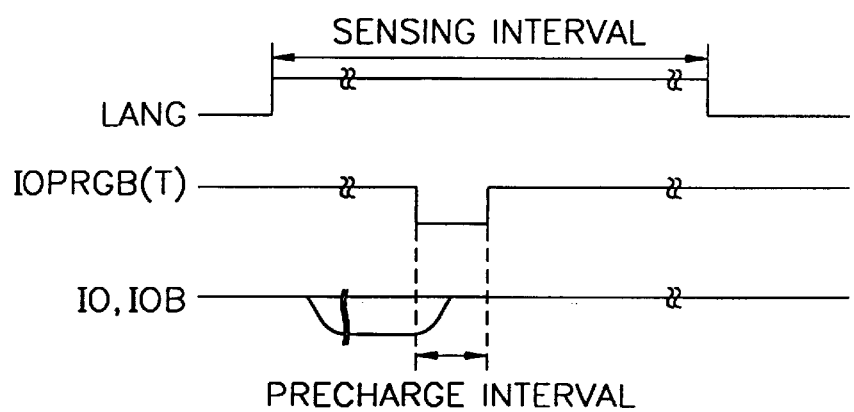
FIG. 3 is a timing diagram showing the main signals used for the equalizing circuits shown in FIGS. 1 and 2.
Figure 5:
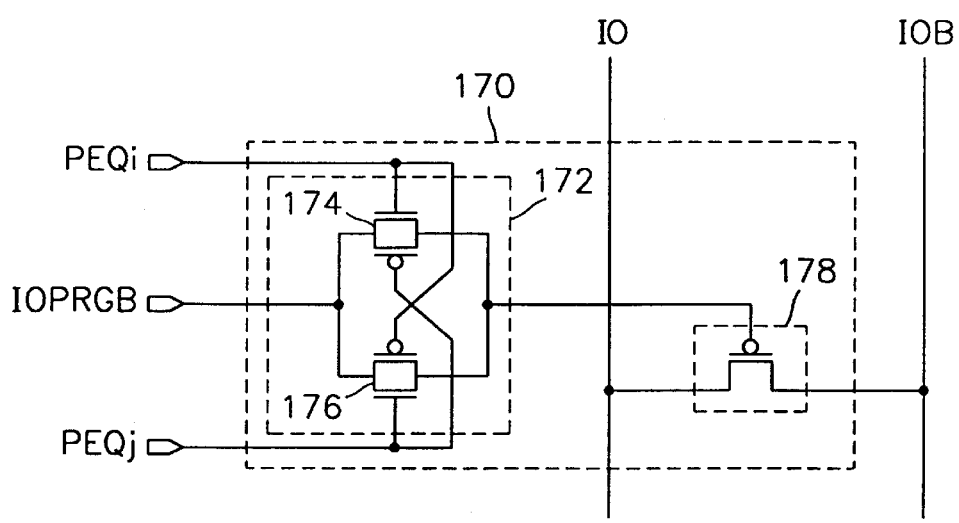
FIG. 5 is a detailed circuit diagram showing an example of the first equalizing circuit shown in FIG. 4.

The conventional equalizing circuit shown in FIG. 1 can be used as either the first equalizing circuit 170 or the second equalizing circuit 180. The equalizing circuit shown in FIG. 5 is preferably used as the first equalizing circuit 170 located at the upper end of the pair of input and output lines IO and IOB. The equalizing circuit shown in FIG. 1 is preferably used as the second equalizing circuit 180 located at the lower end of the pair of input and output lines IO and IOB. A memory device with which the equalizing circuit shown in FIG. 5 can be used is described in more detail with reference to FIG. 6.

FIG. 5 is a detailed circuit diagram showing an example of the first equalizing circuit 170 shown in FIG. 4. The first equalizing circuit 170 according to an embodiment of the present invention maintains the voltage levels of pair of input and output lines IO and IOB at the same voltage level in response to the precharge signal IOPRGB activated during the precharge interval and first and second equalization signals PEQi and PEQj (refer to the timing diagram of FIG. 7). The first equalizing circuit 170 preferably includes an equalization control circuit 172 and an equalizing unit 178.

The equalization control circuit 172 transmits the precharge signal IOPRGB in response to the activation of the first equalization signal PEQi or the second equalization signal PEQj. The precharge signal IOPRGB is provided to control the equalizing unit 178. The equalization control circuit 172 includes first and second transmission gates 174 and 176 which are turned on and off by the first and second equalization signals PEQi and PEQj. The first equalization signal PEQi and the second equalization signal PEQj are activated in response to block selection signals PBLSi and PBLSj for selecting the ith memory block 110 and the jth memory block 210, respectively, shown in FIG. 4.

According to a preferred embodiment of the present invention, the back-bias of the external supply voltage level is applied to transistors in equalizing circuit 170, including the first and second transmission gates 174 and 176, and the first and second equalization signals PEQi and PEQj operate at the external supply voltage level.

The operation of the equalization control circuit 170 is as follows. For example, when the ith or jth memory block 110 or 210 of FIG. 4 is selected, either the first equalization signal PEQi, or the second equalization signal PEQj, is activated to a "high" level, and either the first transmission gate 174 or the second transmission gate 176 is turned on. Then, the equalization control circuit 172 outputs the input precharge signal IOPRGB as the signal for controlling the equalizing unit 178.

The equalizing unit 178 receives the precharge signal IOPRGB from the equalization control circuit 172 and maintains the voltage levels of the pair of input and output lines IO and IOB at the same voltage level during the precharge interval. The equalizing unit 178 is preferably realized by a PMOS transistor. More preferably, the back-bias of the external supply voltage level is applied to the PMOS transistor.

As shown in FIG. 5, the first and second transmission gates 174 and 176, which are controlled by the first and second equalization signals PEQi and PEQj, operate at the external supply voltage level and are used as the first equalizing circuit 170 according to the present invention. Since the back-bias of the external supply voltage level is applied to the first and second transmission gates 174 and 176 and to the equalizing unit 178, it is not necessary to provide an internal supply voltage supply line. Therefore, it is possible to improve the layout efficiency of the peripheral circuit.

Figure 6:
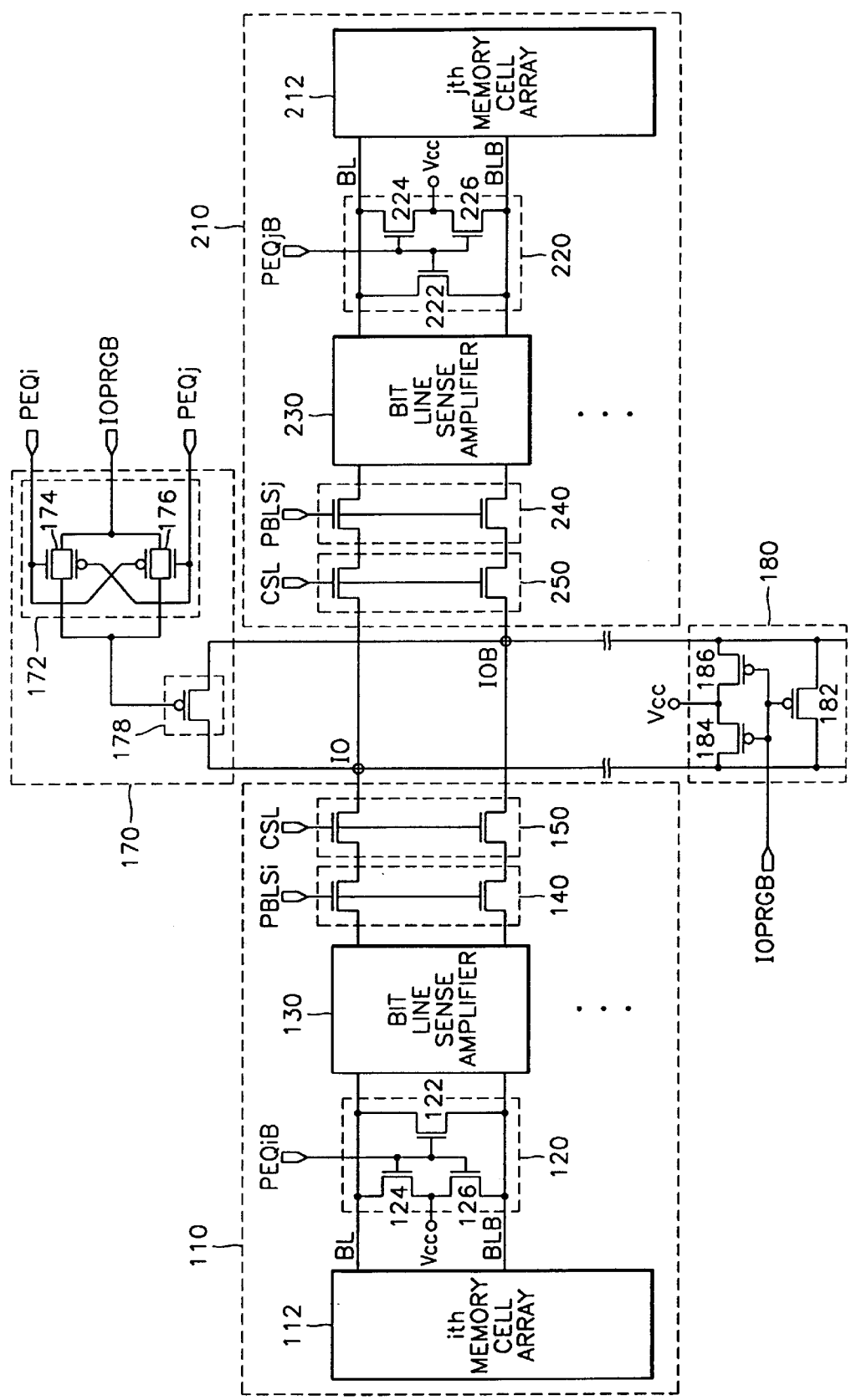
FIG. 6 is a circuit diagram showing a memory device including the equalizing circuits shown in FIGS. 5 and 1 as first and second equalizing circuits.

FIG. 6 is a circuit diagram showing a memory device, including the equalizing circuits shown in FIG. 5 as first and second equalizing circuits, in detail. Here, the ith and jth memory blocks 110 and 210 and the pair of input and output lines IO and IOB located between the ith and jth memory blocks 110 and 210 are illustrated.

As shown in FIG. 6, the ith memory block 110 includes an ith memory cell array 112, a bitline precharge circuit 120, a bitline sense amplifier 130, a block selection switch 140, and a column selection gate 150.

The jth memory block 210 includes a jth memory cell array 212, a bitline precharge circuit 220, a bitline sense amplifier 230, a block selection switch 240, and a column selection gate 250.

The ith and jth memory cell arrays 112 and 212 each includes a plurality of wordlines (not shown) and a plurality of memory cells (not shown) located at the crossing point of a pair of bitlines BL and BLB.

The bitline precharge circuits 120 and 220 precharge the pair bitlines BL and BLB to a predetermined level, for example, a supply voltage Vcc level in response to the deactivation of the first and second equalization signals PEQi and PEQj, respectively. The first and second equalization signals PEQi and PEQj are activated when the memory device is in a stand-by mode and deactivated when the memory device is in an active mode. The bitline precharge circuits 120 and 220 preferably consist of equalizers 122 and 222, respectively, and precharge transistors 124 and 126, and 224 and 226, respectively, for providing the supply voltage Vcc to the pair of bitlines BL and BLB.

The bitline sense amplifiers 130 and 230 sense and amplify data loaded on the pairs of bitlines BL and BLB. The bitline sense amplifiers 130 and 230 shown in FIG. 6 can be realized as a shared sense amplifier structure, which is well-known to those skilled in the art.

The block selection switches 140 and 240 and the column selection gates 150 and 250 connect the pairs of bit lines BL and BLB to the pair of input and output lines IO and IOB in response to the activation of block selection signals PBLSi and PBLSj, respectively, and a column selection signal CSL. Namely, the data loaded on the pair of bitlines BL and BLB are transmitted to the pair of input and output lines IO and IOB in response to the activation of the block selection signals PBLSi and PBLSj and the column selection signal CSL. Here, the block selection signals PBLSi and PBLSj for selecting one of the plurality of memory blocks 110 and 210 are activated in response to a row address strobe signal RASB (not shown in FIG. 6). The column selection signal CSL for selecting a certain column of each memory block is activated in response to a column address strobe signal CASB (not shown in FIG. 6).

The pair of input and output lines IO and IOB provided in the present embodiment are shared by the ith and jth memory blocks 110 and 210. As mentioned above, the first and second equalizing circuits 170 and 180, which are used for precharging the pair of input and output lines IO and IOB from both ends, are provided at both ends of the pair of input and output lines IO and IOB.

The first and second equalizing circuits 170 and 180 precharge the pair of input and output lines IO and IOB to a predetermined voltage level for the writing or reading operation of the memory device. For example, the first and second equalizing circuits 170 and 180 are enabled for the precharge interval of the memory device, thus precharging the pair of input and output lines IO and IOB to a predetermined voltage level. The first and second equalizing circuits 170 and 180 are disabled during an active interval where the writing or reading is performed, in which data is loaded on the pair of input and output lines IO and IOB.

Since the structure a operation of the first equalizing circuit 170 was described above in connection with FIG. 5, no additional description is required.

The second equalizing circuit 180 provided to precharge the pair of input and output lines is activated in response to the precharge signal, thus maintaining the voltage levels of the pair of input and output lines IO and IOB at the same level as the supply voltage level. The second equalizing circuit 180 preferably includes an equalizing transistor 182 and first and second precharge transistors 184 and 186. The equalizing transistor 182 maintains the voltage levels of the pair of input and output lines IO and IOB at the same voltage level in response to the activation of the precharge signal IOPRGB. The first and second precharge transistors 184 and 186 are serially connected to each other and maintain the voltage levels of the pair of input and output lines at a predetermined voltage level in response to the activation of the precharge signal IOPRGB. Even when the pair of input and output lines IO and IOB are long, the first and second equalizing circuits 170 and 180 can correctly maintain the voltage levels of the pair of input and output lines IO and IOB at the predetermined voltage level.

Figure 7:
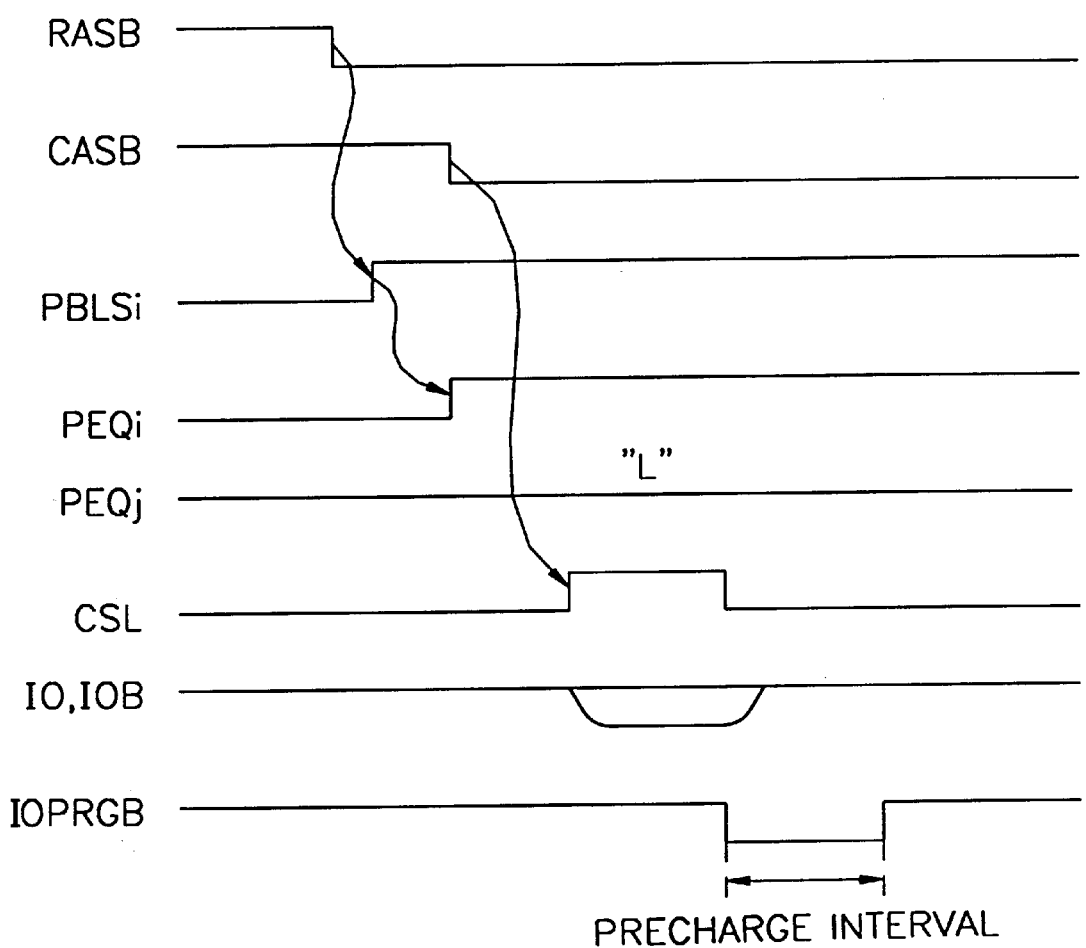
FIG. 7 is a timing diagram showing the main signals used for the memory device shown in FIG. 6.

FIG. 7 is a timing diagram showing the main signals used for the memory device shown in FIG. 6. The operation of the memory device including the equalizing circuit 170 according to the embodiment of the present invention will be described with reference to FIGS. 6 and 7. For the convenience of explanation, a case where the ith memory block 110 is selected is taken as an example.

Since the first and second equalization signals PEQi and PEQj are at a "low" voltage level in a stand-by mode, the bitline precharge circuits 120 and 220 are enabled. Therefore, the pair of bit lines BL and BLB are precharged to the same voltage level, for example, the Vcc voltage level.

When the memory device is in the active state, the row address strobe signal RASB is activated to the "low" level. In response to this, the block selection signal PBLSi for selecting the ith memory block is activated to a "high" level. The first equalization signal PEQi is activated to the "high" level in response to the block selection signal PBLSi. Then, the bitline precharge circuit 120 included in the ith memory block is disabled and a voltage difference is generated between the corresponding pair of bitlines BL and BLB. The data sensed by the pair of bitlines BL and BLB are amplified by the bitline sense amplifier 130.

When the column selection signal CSL is activated in response to the activation of the column address strobe signal CASB, since the block selection switch 140 and the column selection gate 150 are enabled, the selected pair of bitlines BL and BLB and the pair of input and output lines IO and IOB are electrically connected to each other. Accordingly, the data of the pair of bitlines is loaded onto the pair of input and output lines IO and IOB. While the data reading operation proceeds, since the first equalization signal PEQi is at the "high" level and the precharge signal IOPRGB is also in the "high" level, the first and second equalizing circuits 170 and 180 are disabled.

When the data reading operation is completed, the precharge signal IOPRGB is activated to the "low" level. Since the first equalization signal PEQi still remains at the "high" level, the equalizing unit 178 and the equalizing transistor 182 included in the first and second equalizing circuits 170 and 180 are turned on. As a result, the voltage levels of the pair of input and output lines IO and IOB are maintained at the same voltage level, for example, the Vcc level. Since the pair of input and output lines IO and IOB are precharged from both ends by the first and second equalizing circuits 170 and 180, the amount of time taken to precharge the pair of input and output lines IO and IOB is reduced.

According to the present invention, since the equalizing circuits are arranged at both ends of the pair of input and output lines, the precharge speed increases. Also, since the circuit elements of the equalizing circuit operate at the external supply voltage, it is not necessary to additionally provide an internal supply voltage line in the peripheral circuit. Therefore, the layout efficiency of the peripheral circuit is improved.

While this invention has been particularly shown and described with references to preferred embodiments thereof, it will be understood by those skilled in the art that various changes in form and details may be made therein without departing from the spirit and scope of the invention as defined by the appended claims.

We claim:

1. An equalizing circuit for connection to a pair of input and output lines of a memory device, the equalizing circuit comprising:

an equalization control circuit including a first terminal for receiving a first equalization signal, a second terminal for receiving a second, different equalization signal, an input terminal for receiving a precharge signal, and an output terminal for providing a precharge signal in response to activation of the first or second equalization signal; and an equalizing unit having a control terminal coupled to the output terminal of the equalization control circuit, said equalizing unit being connected to the pair of input and output lines, for maintaining the pair of input and output lines at the same voltage level.

2. The equalizing circuit of claim 1, wherein the equalization control circuit, comprises:

a first transmission gate having an input terminal coupled to the input terminal of the equalization control circuit for receiving a precharge signal and an output terminal coupled to the output terminal of the equalization control circuit for outputting the precharge signal in response to the activation of the first equalization signal; and a second transmission gate having input and output terminals commonly connected to the input and output terminals of the first transmission gate, said second transmission gate outputting the precharge signal in response to the activation of the second equalization signal.

3. The equalizing circuit of claim 1, wherein the equalizing unit comprises a PMOS transistor to which a back-bias of an external supply voltage level is applied.

4. A memory device including first and second memory blocks and a pair of input and output lines which are shared by the first and second memory blocks, the memory device comprising:

first and second bitline precharge circuits for precharging to a predetermined voltage a first and a second pair of bitlines associated with the first and second memory blocks respectively;

first and second bitline sense amplifiers associated respectively with the first and second pair of bitlines for sensing and amplifying data on the pairs of bitlines;

a first and a second block selection switch associated respectively with said first and second memory blocks, and a first and a second column selection gate associated respectively with said first and second memory blocks for connecting a selected pair of bitlines of a selected memory block to the pair of input and output lines;

a first equalizing circuit coupled to the pair of input and output lines at a first location, wherein power to said first equalizing circuit is provided by a back-bias of an external supply voltage; and a second equalizing circuit coupled to the pair of input and output lines at a second location spaced apart from said first location.

5. The memory device of claim 4, wherein the first equalizing circuit comprises:

an equalization control circuit for providing at an output terminal a precharge signal in response to activation of a first or a second equalization signal; and an equalizing unit having a control terminal coupled to the output terminal of the equalization control circuit, said equalizing unit being connected to the pair of input and output lines, for maintaining the pair of input and output lines at the same voltage level.

6. The memory device of claim 5, wherein the equalization control circuit comprises:

a first transmission gate having an input terminal for receiving a precharge signal and an output terminal for outputting the precharge signal in response to the activation of the first equalization signal; and a second transmission gate having input and output terminals commonly connected to the input and output terminals of the first transmission gate, said second transmission gate outputting the precharge signal in response to the activation of the second equalization signal.

7. The memory device of claim 4, wherein the second equalizing circuit comprises:

an equalizing transistor coupled to the pair of input and output lines for maintaining the pair of input and output lines at the same voltage level in response to the activation of a precharge signal; and first and second precharge transistors serially connected to each other and coupled to the pair of input and output lines to maintain the pair of input and output lines at a voltage level in response to the activation of the precharge signal.

* * * * *

UNITED STATES PATENT AND TRADEMARK OFFICE
CERTIFICATE OF CORRECTION

PATENT NO. : 6,275,429 B1 Page 1 of 1
DATED : August 14, 2001
INVENTOR(S) : Yong-cheol Bae and Jung-hwa Lee It is certified that error appears in the above-identified patent and that said Letters Patent is hereby corrected as shown below:

Column 2,
Line 10, delete "interial" and insert -- internal --;

Column 3,
Line 9, delete "less" and insert -- lines --;

Column 5,
Line 19, after "pair", insert -- of --; and

Column 6,
Line 4, delete "a" and insert -- and --.

Signed and Sealed this

Seventh Day of January, 2003

JAMES E. ROGAN
*Director of the United States Patent and Trademark Office*